(12) United States Patent
Deng et al.

(10) Patent No.: US 11,501,709 B2
(45) Date of Patent: Nov. 15, 2022

(54) DISPLAY PANEL AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Chengji Deng, Beijing (CN); Dongyu Gao, Beijing (CN); Huihui Li, Beijing (CN); Han Nie, Beijing (CN); Jia Chen, Beijing (CN); Xin Li, Beijing (CN); Gen Zhao, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/552,570

(22) Filed: Dec. 16, 2021

(65) Prior Publication Data
US 2022/0284856 A1 Sep. 8, 2022

(30) Foreign Application Priority Data
Mar. 8, 2021 (CN) .......................... 202110251403.3

(51) Int. Cl.
*G09G 3/3233* (2016.01)
*H01L 27/32* (2006.01)
*H01L 51/50* (2006.01)

(52) U.S. Cl.
CPC ........ *G09G 3/3233* (2013.01); *H01L 27/3211* (2013.01); *H01L 51/5024* (2013.01); *G09G 2300/0876* (2013.01)

(58) Field of Classification Search
CPC ...... G09G 3/3648; G09G 3/20; G09G 3/3614; G09G 3/3607; G09G 2320/0276; G09G 2320/0673; G09G 2320/0233; G09G 2320/0271; G09G 2360/16; G09G 2310/027; G09G 2340/0428; G09G 2300/0443
See application file for complete search history.

(56) References Cited

U.S. PATENT DOCUMENTS

| | | | | |
|---|---|---|---|---|
| 2008/0018573 A1* | 1/2008 | Hsieh | .................... | G09G 3/3406 345/87 |
| 2011/0267325 A1* | 11/2011 | Xi | ......................... | G09G 3/3648 345/98 |
| 2012/0229529 A1* | 9/2012 | Tomizawa | ............... | G09G 5/02 345/690 |

* cited by examiner

*Primary Examiner* — Dong Hui Liang
(74) *Attorney, Agent, or Firm* — Nath, Goldberg & Meyer; Joshua B. Goldberg

(57) ABSTRACT

The embodiment of the present disclosure provides a display panel and a display device. The display panel includes: a first sub-pixel configured to display a first color, a second sub-pixel configured to display a second color, and a third sub-pixel configured to display a third color; when a picture displayed by the display panel is switched from a black picture to a picture having a maximum gray scale of the first color, the second color and the third color, respectively, a ratio of a brightness of a first frame of picture to a maximum value among brightness of stabilized several frames of pictures is a first initial frame brightness proportion, a second initial frame brightness proportion and a third initial frame brightness proportion, respectively; the first, second and third initial frame brightness proportions have a Max-Min less than or equal to a threshold.

20 Claims, 6 Drawing Sheets

Ir(ppy)₃

ADN

First frame  Second frame  Third frame  ......

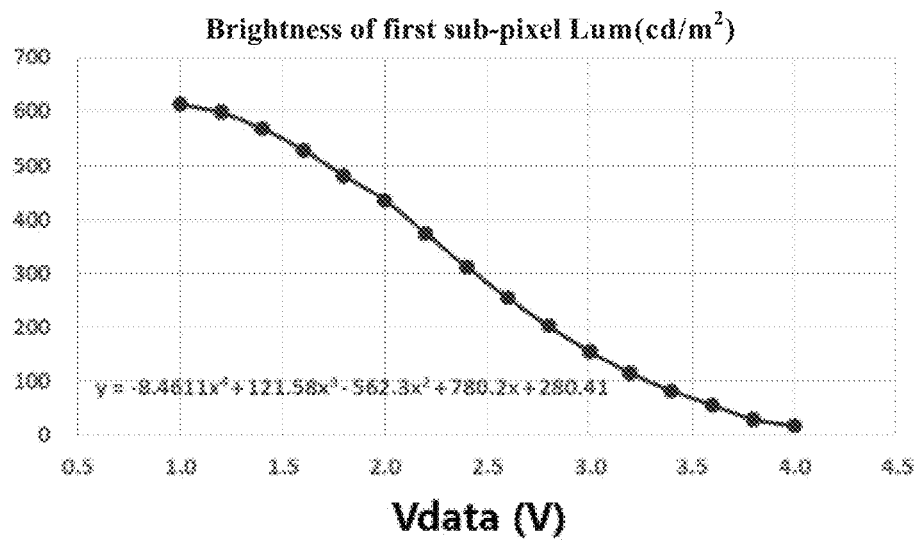
FIG. 11
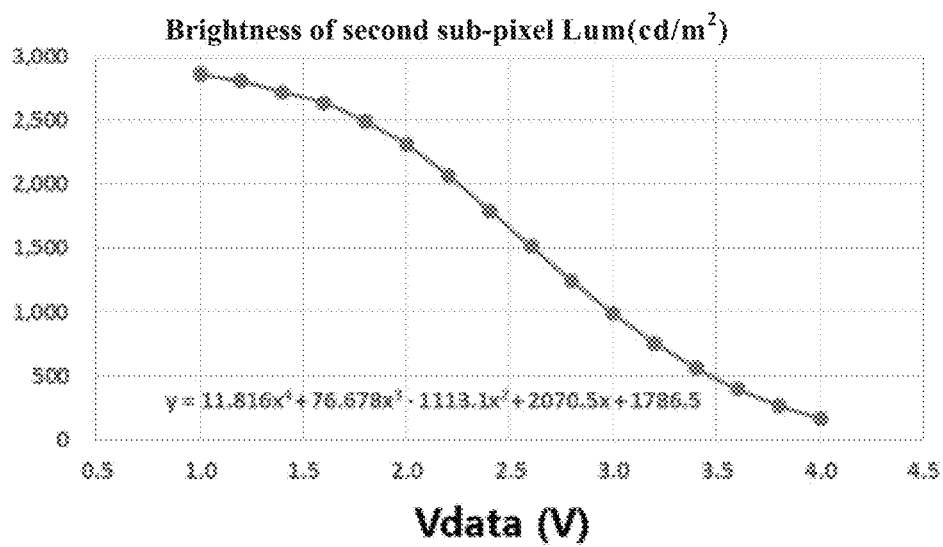
FIG. 12
| Item(s) | Vdata | Brightness of first sub-pixel Lv(cd/m²) | Proportion |
|---|---|---|---|
| Steady state | 2.57 | 266.2 | 100% |
| Initial frame | 2.94 | 171.4 | 64% |
| Target | 2.78 | 210.5 | 79% |
FIG. 13

| Item(s) | Vdata | Brightness of second sub-pixel Lv(cd/m²) | Proportion |
|---|---|---|---|
| Steady state | 3.16 | 812.0 | 100% |
| Initial frame | 3.48 | 476.2 | 59% |
| Target | 3.31 | 643.7 | 79% |

FIG. 14

| Item(s) | Fourth initial frame brightness proportion | First initial frame brightness proportion | Second initial frame brightness proportion | Third initial frame brightness proportion | Max-Min |
|---|---|---|---|---|---|
| Doping proportion 4% | 66% | 64% | 59% | 79% | 20% |
| Doping proportion 2% | 71% | 67% | 67% | 78% | 11% |

FIG. 15

DISPLAY PANEL AND DISPLAY DEVICE

CROSS REFERENCE TO RELATED APPLICATIONS

The present application claims the priority of the Chinese Patent Application No. 202110251403.3 filed on Mar. 8, 2021, the content of which is incorporated herein by reference in its entirety.

TECHNICAL FIELD

The present disclosure relates to the field of display technology, in particular to a display panel and a display device.

BACKGROUND

Display devices (e.g., mobile phones, notebook computers, etc.), such as Organic Light Emitting Diode (OLED) display devices, are used in a variety of applications. For example, when a person uses a smart phone for the purpose of eye protection, a dark background mode is increasingly used. In the dark background mode, pictures are displayed in a form of a dark picture as a background in a combination with light-colored display contents (the display contents may include patterns, characters and the like).

SUMMARY

Embodiments of the present disclosure provide a display panel and a display device.

In a first aspect, embodiments of the present disclosure provide a display panel, including:

a first sub-pixel, a second sub-pixel, and a third sub-pixel, wherein the first sub-pixel is configured to display a first color, the second sub-pixel is configured to display a second color, and the third sub-pixel is configured to display a third color;

when a picture displayed by the display panel is switched from a black picture to a picture having a maximum gray scale of the first color, a ratio of a brightness of a first frame of picture to a maximum value among brightness of stabilized several frames of pictures is a first initial frame brightness proportion;

when a picture displayed by the display panel is switched from a black picture to a picture having a maximum gray scale of the second color, a ratio of a brightness of a first frame of picture to a maximum value among brightness of stabilized several frames of pictures is a second initial frame brightness proportion:

when a picture displayed by the display panel is switched from a black picture to a picture having a maximum gray scale of the third color, a ratio of a brightness of a first frame of picture to a maximum value among brightness of stabilized several frames of pictures is a third initial frame brightness proportion;

the first initial frame brightness proportion, the second initial frame brightness proportion and the third initial frame brightness proportion have a Max-Min less than or equal to a threshold.

In some embodiments of the present disclosure, the threshold is in a range of 0 to 20%.

In some embodiments of the present disclosure, the threshold is 11%.

In some embodiments of the present disclosure, the first sub-pixel includes: a first light emitting device and a first pixel circuit configured to drive the first light emitting device to emit light, the first pixel circuit including a first driving transistor and a first capacitor coupled to a gate of the first driving transistor;

the second sub-pixel includes: a second light emitting device and a second pixel circuit configured to drive the second light emitting device to emit light, the second pixel circuit including a second driving transistor and a second capacitor coupled to a gate of the second driving transistor;

the third sub-pixel includes: a third light emitting device and a third pixel circuit configured to drive the third light emitting device to emit light, the third pixel circuit including a third driving transistor and a third capacitor coupled to a gate of the third driving transistor.

In some embodiments of the present disclosure, a ratio of a capacitance of the first capacitor to a capacitance of the third capacitor is greater than or equal to 0.91 and less than 1;

and/or, a ratio of a capacitance of the second capacitor to the capacitance of the third capacitor is greater than or equal to 0.87 and less than 1.

In some embodiments of the present disclosure, plate distances of the first capacitor, the second capacitor and the third capacitor are equal to each other, and dielectric constants of the first capacitor, the second capacitor and the third capacitor are equal to each other;

a ratio of an effective plate area of the first capacitor to an effective plate area of the third capacitor is greater than or equal to 0.91 and less than 1; and/or a ratio of an effective plate area of the second capacitor to the effective plate area of the third capacitor is greater than or equal to 0.87 and less than 1.

In some embodiments of the present disclosure, effective plate areas of the first capacitor, the second capacitor and the third capacitor are equal to each other, and plate distances of the first capacitor, the second capacitor and the third capacitor are equal to each other;

a ratio of a dielectric constant of the first capacitor to a dielectric constant of the third capacitor is greater than or equal to 0.91 and less than 1; and/or a ratio of a dielectric constant of the second capacitor to the dielectric constant of the third capacitor is greater than or equal to 0.87 and less than 1.

In some embodiments of the present disclosure, effective plate areas of the first capacitor, the second capacitor and the third capacitor are equal to each other, and dielectric constants of the first capacitor, the second capacitor and the third capacitor are equal to each other;

a ratio of a plate distance of the first capacitor to a plate distance of the third capacitor is greater than 1 and less than or equal to 1.1; and/or a ratio of a plate distance of the second capacitor to the plate distance of the third capacitor is greater than 1 and less than or equal to 1.15.

In some embodiments of the present disclosure, the first color is red, the second color is green, and the third color is blue.

In some embodiments of the present disclosure, the first light emitting device is an organic light emitting device for emitting red light and includes a first light emitting layer; the second light emitting device is an organic light emitting device for emitting green light and includes a second light emitting layer; the third light emitting device is an organic light emitting device for emitting blue light and includes a third light emitting layer; a ratio of a volume of a doping material in the second light emitting layer to a volume of the second light emitting layer is 1% to 4%.

In some embodiments of the present disclosure, the first light emitting device is an organic light emitting device for emitting red light and includes a first light emitting layer; the second light emitting device is an organic light emitting device for emitting green light and includes a second light emitting layer; the third light emitting device is an organic light emitting device for emitting blue light and includes a third light emitting layer; a ratio of a volume of a doping material in the second light emitting layer to a volume of the second light emitting layer is 1% to 4%.

In some embodiments of the present disclosure, the doping material in the second light emitting layer is coumarin and a derivative thereof and iridium complex.

In some embodiments of the present disclosure, the ratio of the volume of the doping material in the second light emitting layer to the volume of the second light emitting layer is 2% to 4%.

In some embodiments of the present disclosure, a ratio of a volume of a doping material in the first light emitting layer to a volume of the first light emitting layer is 1% to 4%; and/or, a ratio of a volume of a doping material in the third light emitting layer to a volume of the third light emitting layer is 1% to 4%.

In a second aspect, embodiments of the present disclosure provide a display device, including the display panel provided in any one of the embodiments of the first aspect.

In some embodiments of the present disclosure, the first sub-pixel includes: a first light emitting device and a first pixel circuit configured to drive the first light emitting device to emit light, the first pixel circuit including a first driving transistor and a first capacitor coupled to a gate of the first driving transistor;

the second sub-pixel includes: a second light emitting device and a second pixel circuit configured to drive the second light emitting device to emit light, the second pixel circuit including a second driving transistor and a second capacitor coupled to a gate of the second driving transistor;

the third sub-pixel includes: a third light emitting device and a third pixel circuit configured to drive the third light emitting device to emit light, the third pixel circuit including a third driving transistor and a third capacitor coupled to a gate of the third driving transistor.

In some embodiments of the present disclosure, a ratio of a capacitance of the first capacitor to a capacitance of the third capacitor is greater than or equal to 0.91 and less than 1;

and/or, a ratio of a capacitance of the second capacitor to the capacitance of the third capacitor is greater than or equal to 0.87 and less than 1.

In some embodiments of the present disclosure, plate distances of the first capacitor, the second capacitor and the third capacitor are equal to each other, and dielectric constants of the first capacitor, the second capacitor and the third capacitor are equal to each other; a ratio of an effective plate area of the first capacitor to an effective plate area of the third capacitor is greater than or equal to 0.91 and less than 1; and/or a ratio of an effective plate area of the second capacitor to the effective plate area of plates of the third capacitor is greater than or equal to 0.87 and less than 1.

In some embodiments of the present disclosure, effective plate areas of the first capacitor, the second capacitor and the third capacitor are equal to each other, and dielectric constants of the first capacitor, the second capacitor and the third capacitor are equal to each other;

a ratio of a plate distance of the first capacitor to a plate distance of the third capacitor is greater than 1 and less than or equal to 1.1; and/or a ratio of a plate distance of the second capacitor to the plate distance of the third capacitor is greater than 1 and less than or equal to 1.15.

In some embodiments of the present disclosure, the first light emitting device is an organic light emitting device for emitting red light and includes a first light emitting layer; the second light emitting device is an organic light emitting device for emitting green light and includes a second light emitting layer; the third light emitting device is an organic light emitting device for emitting blue light and includes a third light emitting layer;

a ratio of a volume of a doping material in the second light emitting layer to a volume of the second light emitting layer is 1% to 4%.

BRIEF DESCRIPTION OF DRAWINGS

In order to more clearly illustrate the technical solutions of the embodiments of the present disclosure, drawings used in the description for the embodiments or the prior art will be briefly described below. Obviously, the drawings in the following description are only some embodiments of the present disclosure, and based on this, other drawings may be obtained by one of ordinary skill in the art without inventive efforts.

FIG. 11 is a graph showing the brightness of a first sub-pixel versus a data signal Vdata in a display panel according to the embodiment of the present disclosure;

FIG. 12 is a graph showing the brightness of a second sub-pixel versus a data signal Vdata in a display panel according to the embodiment of the present disclosure;

FIG. 13 shows a simulation result of the brightness of a first sub-pixel versus a data signal Vdata;

FIG. 14 shows a simulation result of the brightness of a second sub-pixel versus a data signal Vdata;

FIG. 15 is a data diagram of a fourth initial frame brightness proportion, a first initial frame brightness proportion, a second initial frame brightness proportion, and a third initial frame brightness proportion when a doping proportion of a doping material in a second light emitting layer is 4% or 2%.

DETAIL DESCRIPTION OF EMBODIMENTS

Figures 1A, 1B, 1C:
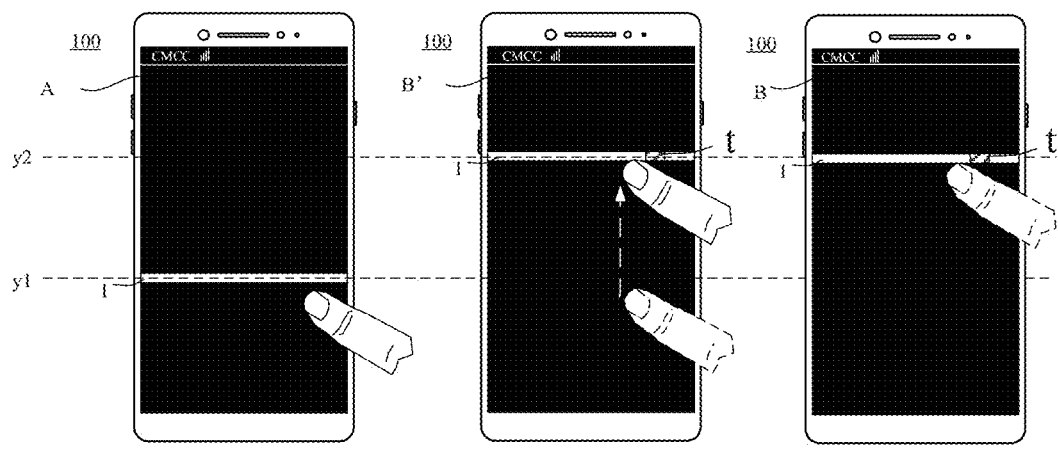
FIGS. 1a to 1c are schematic diagrams illustrating that a picture displayed by a display device is changed from picture A to picture B when a finger of a user slides on a screen during use of the display device by the user.

The technical solutions in the embodiments of the present disclosure will be described clearly and completely with reference to the drawings in the embodiments of the present disclosure. Obviously, the embodiments described are only some embodiments of the present disclosure, rather than all embodiments. All other embodiments, which may be derived by one of ordinary skill in the art from the embodiments disclosed herein without inventive efforts, are intended to be within the scope of the present disclosure.

In the description of the present disclosure, it is to be understood that the terms "center", "upper", "lower", "front", "rear", "left", "right", "vertical", "horizontal", "top", "bottom", "inner", "outer", and the like indicate orientations or positional relationships based on those shown in the drawings, merely for convenience in describing the present disclosure and simplifying the description, and do not indicate or imply that the device or element referred to must have a particular orientation, be constructed in a particular orientation, and be operated, and therefore, should not be construed as limiting the present disclosure.

Unless the context requires otherwise, throughout the description and the claims, terms "comprise" and its other forms, such as "comprises" and "comprising", will be interpreted as open, inclusive, that is, "including, but not limited to". In the description of the specification, terms "one embodiment", "some embodiments", "exemplary embodiments", "example", "specific example" or "some examples" and the like are intended to indicate that a particular feature, structure, material, or characteristic described in connection with the embodiment or example is included in at least one embodiment or example of the present disclosure. The schematic representations of above terms do not necessarily refer to the same embodiment or example. Furthermore, the particular feature, structure, material, or characteristic may be included in any one or more embodiments or examples in any suitable manner.

In the following, terms "first", "second" are used for descriptive purposes only and are not to be understood as indicating or implying relative importance or implicitly indicating the number of technical features indicated. Thus, features defined with the "first" or "second" may explicitly or implicitly include one or more such features. In the description of the embodiments of the present disclosure, "a plurality" means two or more, unless otherwise specified.

In describing some embodiments, expressions "coupled" and "connected" along with their derivatives, may be used. For example, the term "connected" may be used in describing some embodiments to indicate that two or more elements are in direct physical or electrical contact with each other. As another example, the term "coupled" may be used in describing some embodiments to indicate that two or more elements are in direct physical or electrical contact with each other. However, the terms "coupled" or "communicatively coupled" may also mean that two or more elements are not in direct contact with each other, but yet still co-operate or interact with each other. The embodiments disclosed herein are not necessarily limited to the contents herein.

"At least one of A, B and C" has the same meaning as "at least one of A, B or C", both of them include the following combination of A, B and C: A alone; B alone; C alone; a combination of A and B; a combination of A and C; a combination of B and C, and a combination of A, B and C.

"A and/or B" includes the following three combinations: A alone; B alone; and a combination of A and B.

"A plurality" means at least two.

The use of "adapted to" or "configured to" herein means open and inclusive language that does not exclude devices adapted to or configured to perform additional tasks or steps.

Additionally, the use of "based on" is meant to be open and inclusive in that a process, step, calculation, or other action "based on" one or more conditions or values may, in practice, be based on additional conditions or exceed the values.

As used herein, "about," "approximately," or "roughly" includes the stated value as well as an average value within an acceptable range of deviation for a particular value, wherein the acceptable range of deviation is determined by one of ordinary skill in the art in view of a measurement in question and an error associated with a measurement of a particular quantity (i.e., a measurement of a limitation of a system).

Example embodiments are described herein with reference to cross-sectional and/or plan views as idealized example drawings. In the drawings, thickness of layers and regions are exaggerated for clarity. Variations from the shapes of the drawings as a result, for example, of manufacturing techniques and/or tolerances, are to be expected. Thus, example embodiments should not be construed as limited to the shapes of regions illustrated herein, but are to include deviations in shapes that result, for example, from manufacturing. For example, an etched region shown as a rectangle will typically have curved features. Thus, the regions illustrated in the drawings are schematic in nature and their shapes are not intended to illustrate an actual shape of a region of a device and are not intended to limit the scope of exemplary embodiments.

Display devices (e.g., mobile phones, notebook computers, etc.), such as Organic Light Emitting Diode (OLED) display devices, are used in a variety of applications. For example, when a person uses a smart phone for the purpose of eye protection, a dark background mode is increasingly used. In the dark background mode, pictures are displayed in a form of a dark picture as a background in a combination with light-colored display contents (the display contents may include patterns, characters and the like).

However, when a display mode of a mobile phone is configured as the dark background mode, a position of the light-colored display content on the screen is changed as a finger of a user slides on a screen. At this time, the phenomenon that the light-colored display content is color-shifted occurs, which affects the use experience of the user.

FIGS. 1a to 1c are schematic diagrams illustrating that a picture displayed by a display device (e.g., a mobile phone) is changed from picture A to picture B when a finger of a user slides on a screen during use of the display device by the user. The display device 100 is configured to display in a dark background mode, wherein a picture A (shown in FIG. 1a), a picture B' (shown in FIG. 1B) and a picture B (shown in FIG. 1c) are displayed in the dark background mode (for example, with a dark picture as a background), together with the light-colored display content (shown in reference numeral 1). Illustratively, the background in both picture A and picture B is black (e.g., black pictures), and the light-colored display content includes a white strip pattern 1.

The white strip pattern 1 may be discolored when a finger of a user slides on a screen. The reason for the occurrence of the discoloration phenomenon will be explained below.

Figure 2:
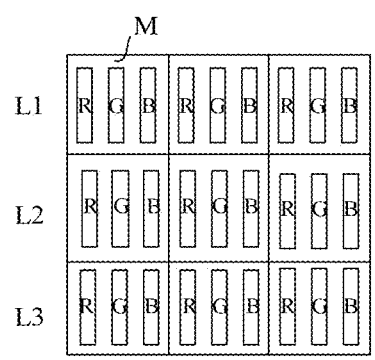
FIG. 2 is a structural diagram of a 3*3 pixel structure (which may also be referred to as a pixel array) at a position t in FIGS. 1a to 1c.

The display device 100 may include a plurality of pixels, which emit colored light such that the display device 100 may display a color picture. FIG. 2 shows a 3*3 pixel structure (which may also be referred to as a pixel array) at a position t in the display device 100 in FIG. 1b or 1c. For example, referring to FIG. 1b or FIG. 1c and FIG. 2, when a pixel in the pixel structure displays a certain color, a portion at the t position in a picture (screen) displayed by the display device 100 has a corresponding color.

The pixel may include a plurality of sub-pixels emitting different colors. A conversion of a brightness of the sub-pixels may realize a conversion of colors displayed by the pixel, and further, a conversion of pictures displayed by the display device 100. Illustratively, as shown in FIG. 2, M is one pixel, which includes three sub-pixels: a red (denoted as R) sub-pixel emitting red light, a green (denoted as G) sub-pixel emitting green light, and a blue (denoted as B) sub-pixel emitting blue light. The light of three colors enters human eyes, and the combination of the light of the three colors which may be sensed by the human eyes is the color which may be recognized by the human eyes. That is, the color displayed by the pixel M depends on the brightness of the light of the three colors emitted by the sub-pixels in the pixel M. Further, the picture displayed by the display device 100 depends on the colors displayed by the plurality of pixels. When the (actual) brightness of light of the three colors has a specific proportion, the color displayed by the pixel M belongs to a specific color family; when the proportion of the brightness of light of the three colors deviates from the specific proportion, the color displayed by the pixel M deviates from the specific color family, and the color displayed by the pixel M is color-shifted. The brightness of different colors belonging to a same color family may be different from each other, but they have a same tint (hue and chroma). For example, when two colors belong to a same color family, they have a same tint; when two colors do not belong to the same color family, the tints of the two colors are different. Therefore, the brightness of each sub-pixel in the pixel M is controlled based on pixel data (also referred to as gray scale data) of each pixel M, so as to adjust the color displayed by the pixel M, and further control the picture displayed by the display device 100. For example, the pixel data may include: components of all the sub-pixels, such as an R component, a G component, and a B component, which may be referred to as a gray scale of the R sub-pixel, a gray scale of the G sub-pixel, and a gray scale of the B sub-pixel, respectively. The brightness of red light emitted by the R sub-pixel, the brightness of green light emitted by the G sub-pixel and the brightness of blue light emitted by the B sub-pixel are controlled based on the gray scale of the R sub-pixel, the gray scale of the G sub-pixel and the gray scale of the B sub-pixel, so as to adjust the color displayed by the pixel M. For example, the gray scale of each sub-pixel may be 0 to 255, where 255 is the maximum gray scale. For example, for pixel data of R=255, G=0, and B=0, and pixel data of R=100, G=0, and B=0, the colors of the pictures displayed by the display device are red, and belong to the same color family, but have different brightness.

Further, the display device 100 may display a picture in a display mode in which pictures are displayed frame by frame. Illustratively, when a refresh rate of the display device 100 is 60 Hz, i.e., the display device 100 displays 60 frames of pictures per second, a display period of each frame of picture is 1/60 seconds (i.e., 16.7 milliseconds).

On this basis, with continued reference to FIGS. 1 and 2, when the user's finger slides on the screen, the display device 100 displays a plurality of frames of pictures in the process of changing the picture displayed by the display device 100 from picture A to picture B. FIG. 1a shows a picture A as a first frame (denoted as $n_1^{th}$ frame) of picture in which the white strip pattern 1 is located at a y1 position. At this time, at a y2 position, the pixel data of three rows of pixels L1 to L3 are all R=0, G=0, and B=0, for example. These pixels all display black. After the display device 100 refreshes i (i≥1) frames of picture with the slide operation of the finger, the white strip pattern 1 moves from the y1 position to the y2 position. At this time, the pixel data of three rows of pixels L1 to L3 at the y2 position are R=255, G=255, and B=255, for example. FIG. 1b shows a picture B', which is a first frame (denoted as the $n_{i+1}^{th}$ frame) after the white strip pattern 1 is moved to the y2 position. Subsequently, the finger is detached from the screen, and the display device 100 continues to refresh several frames, and then, the display device 100 displays a picture B shown in FIG. 1c. In these several frames, the white strip pattern 1 still stays at the y2 position. At this time, the pixel data of the three rows of pixels L1 to L3 at the y2 position are still R=255, G=255, and B=255, for example.

In the i frames of pictures refreshed by the display device 100 during changing from picture A to picture B', the position of the white strip pattern 1 in the latter frame of picture is the same as or shifted upward compared to that of the white strip pattern 1 in the previous frame of picture. For example, in the previous frame (e.g., the $n_i^{th}$ frame) of picture in the picture B', the gray scale data of three rows of pixels L1 to L3 are all R=0, G=0 and B=0, for example, and all of them display black. In the $n_{i+1}^{th}$ frame of picture, the gray scale data of three rows of pixels L1 to L3 are, for example, R=255, G=255, and B=255, so that the user may see the position of the white strip pattern 1 shifted upward. During changing from the $n_i^{th}$ frame of picture to the $n_{i+1}^{th}$ frame of picture, the brightness of the respective sub-pixels in the three rows of pixels L1 to L3 gradually increases with time, such that the respective sub-pixels in the three rows of pixels L1 to L3 in the picture B' have not yet reached the state in which the brightness thereof is maximized.

Since the gray scale data of the three rows of pixels L1 to L3 (for example, R=255, G=255, and B=255) remains unchanged from the time when the display device 100 switches to the picture B', after refreshing several frames of pictures, the brightness of each sub-pixel in the three rows of pixels L1 to L3 still gradually increases to a certain extent with time, and remains substantially unchanged. That is, the brightness of each sub-pixel remains stable, and the picture displayed at this time is referred to as a picture in a stable display state, for example, the picture B. When the display device 100 displays the picture B, the brightness of the R, G, B sub-pixels in the three rows of pixels L1 to L3 is respectively denoted as $LR_s$, $LG_s$ and $LB_s$.

However, the R, G, B sub-pixels have different brightness change rates from the darkest state (e.g., brightness corresponding to gray scale 0) to the brightest state (e.g., brightness corresponding to gray scale 255) over time, such that before the display device 100 reaches the stable display state, a proportion of the brightness of the R, G, B sub-pixels in the three rows of pixels L1 to L3 deviates from a proportion of the three sub-pixels after the display device 100 reaches the stable display state. For example, when the display device 100 displays the picture B', the brightness of R, G, B sub-pixels in three rows of pixels L1 to L3 is respectively denoted as $LR_{i+1}$, $LG_{i+1}$ and $LB_{i+1}$, and at this time, $LR_{i+1}:LG_{i+1}:LB_{i+1}$ and $LR_s:LG_s:LB_s$ are not equal to each other, thereby causing the tint of the strip pattern 1 in the picture B' to deviate from the tint of the strip pattern 1 in the picture B. For example, the strip pattern 1 in picture B' is blue or magenta, and the strip pattern 1 in picture B is white. For another example, the tint of the strip pattern 1 in the first several frames of pictures after the display picture B' may also deviate from the tint of the strip pattern 1 in the picture B before the display device 100 reaches the stable display state.

Similarly, in the process of the display device 100 changing from the picture A to the picture B' with time, respective sub-pixels of the plurality of rows of pixels from the y1 position to the y2 position in the display device 100 need to start emitting light from the darkest state, but cannot reach the brightest state immediately, so that the tint of the strip pattern 1 in the i frames of pictures in this process also deviates from the tint of the strip pattern 1 in the picture B.

In order to solve the above-described problem, embodiments of the present disclosure provide a display device. The display device is a product having an image display function, and may be, for example, a display, a television, a billboard, a digital photo frame, a laser printer with a display function, a telephone, a mobile phone, a Personal Digital Assistant (PDA), a digital camera, a camcorder, a viewfinder, a navigator, a vehicle, a large-area wall, a home appliance, an information inquiry apparatus (e.g., a business inquiry apparatus, a monitor, etc. in departments of e-government, banking, hospital, electric power, etc.).

In some embodiments, the display device may include a display panel (DP). The display device may further include a driving circuit coupled to the display panel. The driving circuit is configured to provide an electrical signal to the display panel. Illustratively, the driving circuit may include: a source driver IC. The source driver is configured to provide a data driving signal (also referred to as a data signal) to the display panel. The driving circuit may further include a timer control register (TCON) coupled to the source driver, and the like.

In some embodiments, the display panel may be an electroluminescent display panel, and normal display of the display panel is achieved by electroluminescent devices within the display panel. Illustratively, the display panel may be an OLED (organic light emitting diode) display panel, a QLED (quantum dot light emitting diode) display panel, a micro LED (including a mini LED or a micro LED, where the LED is a light emitting diode) display panel, or the like.

Figure 3:
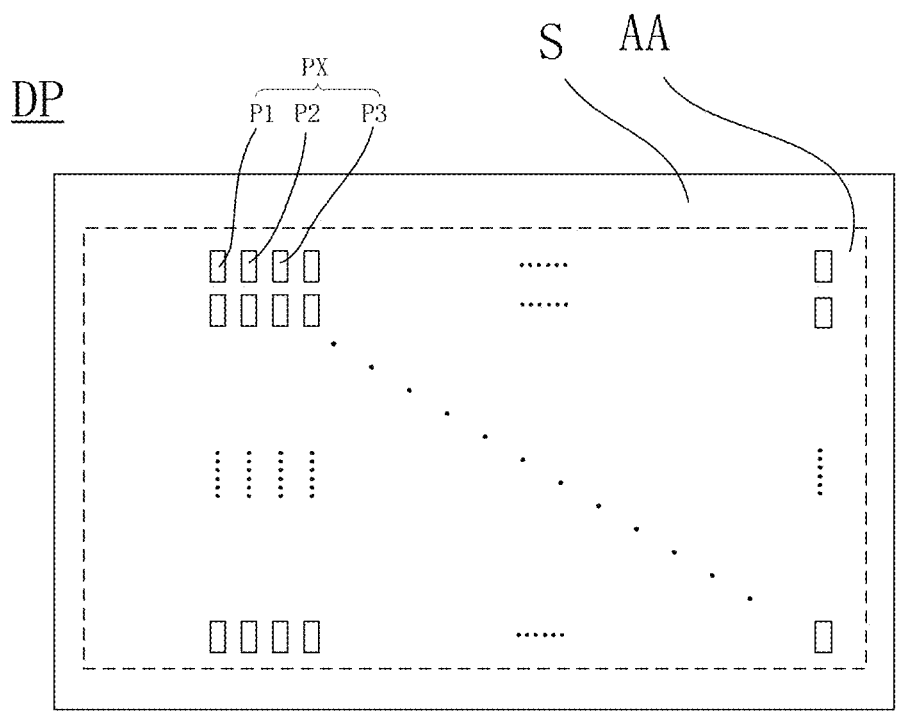
FIG. 3 is a structural diagram of a display panel according to an embodiment of the present disclosure.

FIG. 3 is a structural diagram of a display panel according to an embodiment of the present disclosure. In some embodiments, referring to FIG. 3, the display panel DP includes a plurality of sub-pixels PX. Illustratively, the plurality of sub-pixels PX may be arranged in an array. For example, the display panel DP has an active area (AA) and a peripheral area S. The plurality of sub-pixels PX of the display panel DP are located in the AA area. In some embodiments, the plurality of sub-pixels PX include a first sub-pixel P1, a second sub-pixel P2, and a third sub-pixel P3. The first sub-pixel P1 is configured to display a first color, the second sub-pixel P2 is configured to display a second color, and the third sub-pixel P3 is configured to display a third color. Illustratively, the first, second, and third colors are three primary colors; for example, the first color is red, the second color is green, and the third color is blue. In the embodiment of the present disclosure, an example is taken in which the first sub-pixel is a red sub-pixel, the second sub-pixel is a green sub-pixel, and the third sub-pixel is a blue sub-pixel. However, the first sub-pixel is a red sub-pixel, the second sub-pixel is a green sub-pixel, and the third sub-pixel is a blue sub-pixel, which does not limit the scope of the embodiments of the present disclosure.

As explained above, when the pixel data of the display panel changes, for example, from the pixel data A to the pixel data B, such that during the first sub-pixel P1, the second sub-pixel P2 and the third sub-pixel P3 switch from a state of smaller brightness (corresponding to the pixel data A) to a state of larger brightness (corresponding to the pixel data B), the display panel may display n frames of pictures (n≥1). In this process, the color-shifting of the portion of the picture displayed by the display panel DP at the sub-pixels in the process may be solved by controlling a deviation degree of the proportion of the brightness of the light emitted by the sub-pixels in the first several frames of pictures corresponding to the pixel data B (including a first frame of picture corresponding to the pixel data B, and also including at least one frame of picture corresponding to the pixel data B after the first frame of picture) to the proportion of the brightness of the light emitted by the sub-pixels in pictures corresponding to the pixel data B in the stable display state. Specifically, the color-shifting of the portion of the picture displayed by the display panel DP at the sub-pixels in the process may be solved by controlling a deviation degree of the proportion of the brightness of light of the first color emitted by the first sub-pixel P1; the brightness of light of the second color emitted by the second sub-pixel P2; the brightness of light of the third color emitted by the third sub-pixel P3 to the proportion of the brightness of light of the first color emitted by the first sub-pixel P1, the brightness of light of the second color emitted by the second sub-pixel P2; the brightness of light of the third color emitted by the third sub-pixel P3 in pictures corresponding to the pixel data B in the stable display state.

In the above process, for all of the first sub-pixel P1, the second sub-pixel P2, and the third sub-pixel P3, a ratio of the brightness of the light emitted by the sub-pixels in the first several frames of pictures corresponding to the pixel data B to the brightness of the light emitted by the sub-pixels in pictures corresponding to the pixel data B in the stable display state may be characterized by an initial frame brightness proportion. The initial frame brightness proportion is an experimental test value, and the initial frame brightness proportion is a ratio of the brightness of a first frame of picture to the brightness of a picture having the maximum brightness in the plurality of frames of pictures in the stable display state when the picture displayed by the display panel is switched from a black picture (for example, a picture when R=0, G=0, and B=0) to a picture having a maximum gray scale of a color displayed by the sub-pixel (for example, when the color displayed by the sub-pixel is red, the picture having a maximum gray scale of the color is a picture when R=255, G=0, and B=0) (that is, when the display panel displays the picture of only one color). The brightness of one frame of picture is the average brightness of the pictures displayed by the display panel in the display period of one frame of picture. Illustratively, when the refresh rate of the display panel is 60 Hz, from when the picture displayed by the display panel is switched from a black picture to a pure color picture, the brightness of the first frame of picture is the average brightness of the pictures displayed by the display panel within 0 seconds to 16.7 milliseconds (i.e., within the display period in which the display panel displays the first frame of picture). In the embodiment of the present disclosure, the brightness of the pictures displayed by the display panel is not stable just when entering the display stage, but gradually becomes the stable over time.

Figure 4:
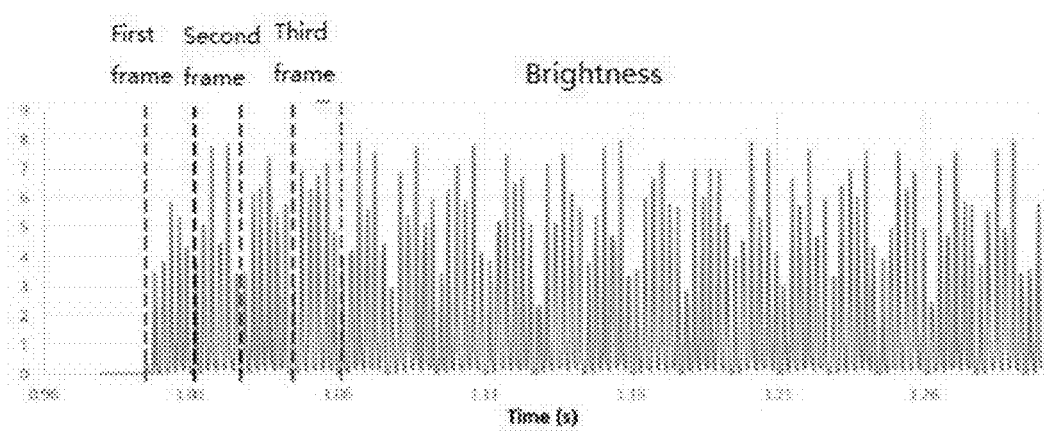
FIG. 4 is a schematic diagram illustrating a change in brightness (luminance) of a picture of each frame as the number of frames increases in a display stage according to an embodiment of the present disclosure.

FIG. 4 is a schematic diagram illustrating a change in brightness (luminance) of a picture of each frame as the number of frames increases in a display stage according to an embodiment of the present disclosure. Referring to FIG. 4, in the display stage, the brightness of only the first several frames of pictures is gradually increased until a stable display state is reached, i.e., a display state in which the brightness of the displayed pictures is substantially unchanged. On the basis, the maximum value among brightness of the stabilized several frames of pictures may be the maximum brightness of the brightness of the several frames of pictures of the display panel in the stable display state. Illustratively, the maximum value among brightness of the stabilized several frames of pictures may be the maximum brightness among the brightness of the pictures of the $W^{th}$ frame to the sixtieth frame from when the picture displayed by the display panel is switched from a black picture to a certain pure color picture, where $2 \leq W \leq 60$, and W may be 10, 15, 20, or the like, for example. In the embodiment of the present disclosure, as shown in FIG. 4, the horizontal axis represents the test time. When the test time is 1 second (Is), a process of switching the picture displayed by the display panel from a black picture to a certain pure color picture is started.

As the initial frame brightness proportion is greater, the ratio of the brightness of light emitted from the sub-pixel in the first several frames of the pictures corresponding to the pixel data B to the brightness of light emitted from the sub-pixel in the pictures corresponding to the pixel data B in the stable display state is greater in the process in which the pixel data of the display panel is changed from the pixel data A to the pixel data B and the sub-pixel is switched from the state of small brightness (corresponding to the pixel data A) to the state of large brightness (corresponding to the pixel data B).

In some embodiments, when the picture displayed by the display panel is switched from a black picture to a picture having a maximum gray scale of a first color, a ratio of the brightness of a first frame of picture to the maximum value among brightness of stabilized several frames of pictures is a first initial frame brightness proportion; when the picture displayed by the display panel is switched from a black picture to a picture having a maximum gray scale of a second color, a ratio of the brightness of a first frame of picture to the maximum value among brightness of stabilized several frames of pictures is a second initial frame brightness proportion; when the picture displayed by the display panel is switched from a black picture to a picture having a maximum gray scale of a third color, a ratio of the brightness of a first frame of picture to the maximum value among brightness of stabilized several frames of pictures is a third initial frame brightness proportion.

Illustratively, the first color is red, the second color is green, and the third color is blue; the display panel supports 24-bit true color, and the gray scales displayed by the first sub-pixel P1, the second sub-pixel P2 and the third sub-pixel P3 are all from 0 gray scale to 255 gray scale. On the basis, the first initial frame brightness proportion may be a ratio of the brightness of the first frame of picture to the maximum value among the brightness of the second frame to the sixtieth frame of pictures when the picture displayed by the display panel is switched from the black picture to a picture having the maximum gray scale (255 gray scale) of red. The second initial frame brightness proportion may be a ratio of the brightness of the first frame of picture to the maximum value among the brightness of the second frame to the sixtieth frame of pictures when the picture displayed by the display panel is switched from the black picture to a picture having the maximum gray scale (255 gray scale) of green. The third initial frame brightness proportion may be a ratio of the brightness of the first frame of picture to the maximum value among the brightness of the second frame to the sixtieth frame of pictures when the picture displayed by the display panel is switched from the black picture to a picture having the maximum gray scale (255 gray scale) of blue.

In some embodiments, the first, second and third initial frame brightness proportions have a Max-Min (range) less than or equal to a threshold. In some embodiments, the threshold is in a range of 0 to 20%. In some embodiments, the threshold is 11%.

The Max-Min of a set of data is the maximum value minus the minimum value in the set of data, and may be used to evaluate the dispersion of the set of data. Illustratively, the Max-Min of the first initial frame brightness proportion, the second initial frame brightness proportion, and the third initial frame brightness proportion is a value obtained by subtracting the minimum value from the maximum value among the first initial frame brightness proportion, the second initial frame brightness proportion, and the third initial frame brightness proportion, and may be used to evaluate the dispersion of the first initial frame brightness proportion, the second initial frame brightness proportion, and the third initial frame brightness proportion.

When the pixel data of the display panel DP changes, for example, from the pixel data A1 to the pixel data B1, so that during the displayed picture is switched from the black picture (corresponding to the pixel data A1) to the white picture (corresponding to the pixel data B1) displayed in the stable state, the first sub-pixel P1, the second sub-pixel P2, and the third sub-pixel P3 of the display panel DP are also switched from the non-light emitting state (corresponding to the pixel data A1) to the state where the brightness is maximum (i.e., the stable state, corresponding to the pixel data B1). When the first initial frame brightness proportion, the second initial frame brightness proportion and the third initial frame brightness proportion are equal to each other, a ratio of the brightness of light of the first color emitted by the first sub-pixel P1, the brightness of light of the second color emitted by the second sub-pixel P2 and the brightness of light of the third color emitted by the third sub-pixel P3 in the above process, in the first frame of picture corresponding to the pixel data B1 is equal to a ratio of the brightness of light of the first color emitted by the first sub-pixel P1, the brightness of light of the second color emitted by the second sub-pixel P2 and the brightness of light of the third color emitted by the third sub-pixel P3 in pictures corresponding to the pixel data B1 in the stable display state. At this time, compared with the white picture with the maximum brightness displayed by the display panel in the stable display state, the color displayed by the display panel in the first frame of picture is white with the same or smaller brightness, and no color cast phenomenon occurs.

The smaller the Max-Min of the first initial frame brightness proportion, the second initial frame brightness proportion, and the third initial frame brightness proportion is, the smaller the dispersion is, and the closer the values of the first initial frame brightness proportion, the second initial frame brightness proportion, and the third initial frame brightness proportion are to each other. In the above process, a ratio of the brightness of light of the first color emitted by the first sub-pixel P1, the brightness of light of the second color emitted by the second sub-pixel P2 and the brightness of light of the third color emitted by the third sub-pixel P3 in the first several frames of pictures corresponding to the pixel data B1 is closer to a ratio of the brightness of light of the first color emitted by the first sub-pixel P1, the brightness of light of the second color emitted by the second sub-pixel P2 and the brightness of light of the third color emitted by the third sub-pixel P3 in pictures corresponding to the pixel data B1 in the stable display state, such that the degree of color cast in the first several frames of pictures corresponding to the pixel data B1 becomes smaller with respect to pictures displayed in the stable display state. When the first initial frame brightness proportion, the second initial frame brightness proportion, and the third initial frame brightness proportion have the Max-Min of less than or equal to 20%, the color of the first several frames of pictures corresponding to the pixel data B1 has a smaller degree of color cast than the color of the display pictures corresponding to the pixel data B1 in the stable display state, and thus, is difficult to be perceived by human eyes. The smaller the Max-Min of the first initial frame brightness proportion, the second initial frame brightness proportion, and the third initial frame brightness proportion is, the higher the display quality is. In some embodiments, the first initial frame brightness proportion, the second initial frame brightness proportion and the third initial frame brightness proportion have a Max-Min of less than or equal to 11%. Thus, the display quality of the display panel is higher.

Accordingly, when the pixel data of the display panel DP changes, for example, from the pixel data A2 to the pixel data B2, so that during the first sub-pixel P1, the second sub-pixel P2, and the third sub-pixel P3 are switched from a state in which the brightness is small (corresponding to the pixel data A2) to the state where the brightness is great (corresponding to the pixel data B2), if the Max-Min of the first initial frame brightness proportion, the second initial frame brightness proportion, and the third initial frame brightness proportion is smaller, in the above process, a ratio of the brightness of light of the first color emitted by the first sub-pixel P1, the brightness of light of the second color emitted by the second sub-pixel P2 and the brightness of light of the third color emitted by the third sub-pixel P3 in the first several frames of pictures corresponding to the pixel data B2 deviates from, a ratio of the brightness of light of the first color emitted by the first sub-pixel P1, the brightness of light of the second color emitted by the second sub-pixel P2 and the brightness of light of the third color emitted by the third sub-pixel P3 in pictures corresponding to the pixel data B2 in the stable display state, to a smaller degree, such that in the process, the deviation degree of color of the portion of pictures displayed by the display panel at these sub-pixels is smaller. When the first initial frame brightness proportion, the second initial frame brightness proportion, and the third initial frame brightness proportion have the Max-Min of less than or equal to 20%, the degree of color cast is smaller, and thus, is difficult to be perceived by human eyes. Thus, the problem of color cast of pictures displayed by the display panel may be solved.

The smaller the Max-Min of the first initial frame luminance proportion, the second initial frame luminance proportion, and the third initial frame luminance proportion is, the higher the display quality is. In some embodiments, the first initial frame luminance proportion, the second initial frame luminance proportion and the third initial frame luminance proportion have a Max-Min of less than or equal to 11%. Thus, the display quality of the display panel is higher.

Figure 5:
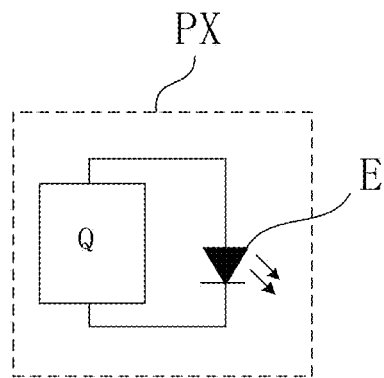
FIG. 5 is a structural diagram of a sub-pixel in a display panel according to an embodiment of the present disclosure.

FIG. 5 is a structural diagram of a sub-pixel in a display panel according to an embodiment of the present disclosure. In some embodiments, referring to FIG. 5, a plurality of sub-pixels PX (e.g., each sub-pixel PX as shown in FIG. 5) include a light emitting device E and a pixel circuit Q configured to drive the light emitting device E to emit light. The pixel circuit Q is coupled to the light emitting device E and configured to provide a driving signal (e.g., a driving current) to the light emitting device E to drive the light emitting device E to emit light. The first sub-pixel P1 includes a first light emitting device E1 and a first pixel circuit Q1 configured to drive the first light emitting device E1 to emit light. The second sub-pixel P2 includes a second light emitting device E2 and a second pixel circuit Q2 configured to drive the second light emitting device E2 to emit light. The third sub-pixel P3 includes a third light emitting device E3 and a third pixel circuit Q3 configured to drive the third light emitting device E3 to emit light. The pixel circuit Q (e.g., the pixel circuits Q1, Q2, and Q3) may be composed of electronic devices such as a Thin Film Transistor (TFT) and a Capacitor (C). The specific structure of the pixel circuit Q is not limited in the embodiments of the present disclosure, and the pixel circuit Q may be designed according to actual situations, for example, the pixel circuit Q may include a plurality of thin film transistors and a plurality of capacitors. The plurality of thin film transistors may include a driving transistor and a switching transistor. The switching transistor may control the on/off of the circuit, and the driving transistor outputs driving current for driving the light emitting device to emit light.

Figure 6:
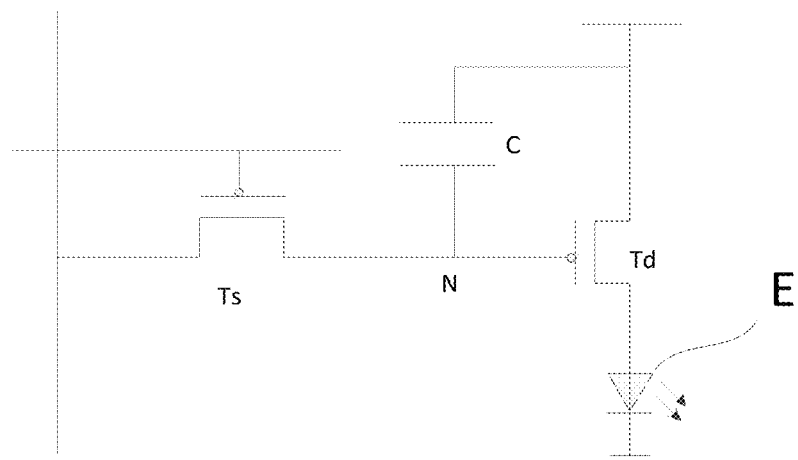
FIG. 6 is a circuit diagram of a sub-pixel in a display panel according to an embodiment of the present disclosure.

In some embodiments, the pixel circuit Q includes a driving transistor Td, and a capacitor C coupled to a gate of the driving transistor Td. FIG. 6 is a circuit diagram of a sub-pixel in a display panel according to an embodiment of the present disclosure. Illustratively, as shown in FIG. 6, the pixel circuit Q includes two thin film transistors (one switching transistor Ts and one driving transistor Td) and one capacitor C, thereby constituting a 2T1C structure. Illustratively, the pixel circuit Q may also be a structure of 7T1C. The first pixel circuit Q1 includes a first driving transistor Td1 and a first capacitor C1 coupled to a gate of the first driving transistor Td1. The second pixel circuit Q2 includes a second driving transistor Td2 and a second capacitor C2 coupled to a gate of the second driving transistor Td2. The third pixel circuit Q3 includes a third driving transistor Td3 and a third capacitor C3 coupled to a gate of the third driving transistor Td3. In some embodiments, the light emitting device E may be an organic light emitting device. The first light emitting device E1 may be an organic light emitting device capable of emitting red light, the second light emitting device E2 may be an organic light emitting device capable of emitting green light, and the third light emitting device E3 may be an organic light emitting device capable of emitting blue light. The organic light emitting device may be a current driving type light emitting device, the light emission luminance of which is determined by the driving current of the driving transistor Td.

In some embodiments, the light emitting device E may include a light emitting layer. The first light emitting device E1 includes a first light emitting layer, the second light emitting device E2 includes a second light emitting layer, and the third light emitting device E3 includes a third light emitting layer. Each light emitting layer may include a main material and a doping material. Illustratively, the first light emitting layer includes a main material and a doping material, the doping material being a red doping material; illustratively, the second light emitting layer includes a main material and a doping material, the doping material being a green doping material; illustratively, the third light emitting layer includes a main material and a doping material, the doping material being a blue doping material.

Figure 7:
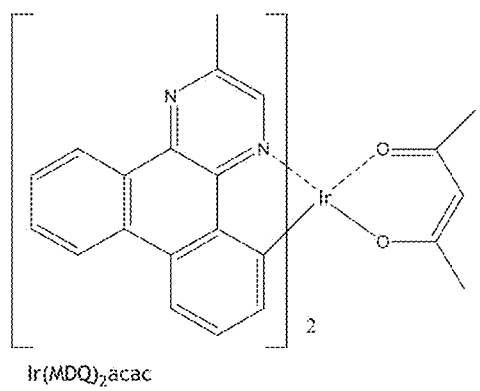
FIG. 7 shows a chemical formula of a red doping material in a display panel according to an embodiment of the present disclosure.
Figure 8:
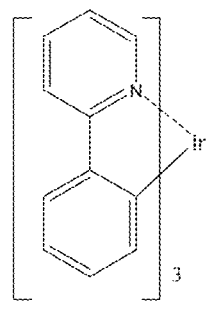
FIG. 8 shows a chemical formula of a green doping material in a display panel according to an embodiment of the present disclosure.
Figure 9:
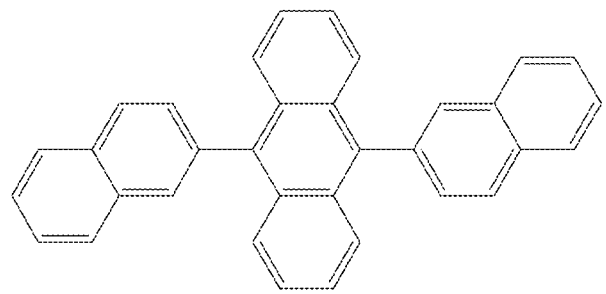
FIG. 9 shows a chemical formula of a blue doping material in a display panel according to an embodiment of the present disclosure.

FIG. 7 shows a chemical formula of a red doping material in a display panel according to an embodiment of the present disclosure; FIG. 8 shows a chemical formula of a green doping material in a display panel according to an embodiment of the present disclosure; FIG. 9 shows a chemical formula of a blue doping material in a display panel according to an embodiment of the present disclosure. A carbazole derivative, a fluorene derivative, an aryl silane derivative, or the like may be used as the main material. Rubrene, (E)-2-(2-(4-(dimethylamino) styryl)-6-methyl-4H-pyran-4-ylidene) malononitrile (DCM) and a derivative thereof, iridium complex (bis(1-phenylisoquinoline) (acetylacetone) iridium (III), etc.), osmium complex, europium complex may be used as the red doping material. For example, the red doping material may be an iridium complex represented by the chemical formula in FIG. 7. Coumarin and a derivative thereof, iridium complex (tris (2-phenylpyridine) iridium (III) and the like may be used as the green doping material. For example, the green doping material may be tris (2-phenylpyridine) iridium (III), which may be denoted as Ir(ppy) 3, and may be represented by the chemical formula in FIG. 8. Perylene, iridium complexes (bis (3, 5-difluoro-2-(2-pyridyl) phenyl-(2-carboxy pyridyl) iridium (III): FIrpic, etc.), AND (9,10-di-(2-naphthyl) anthracene, 9, 10-bis (2-naphthyl) anthracene) may be used as the blue doping material. AND may be represented by the formula in FIG. 9.

Figure 10:
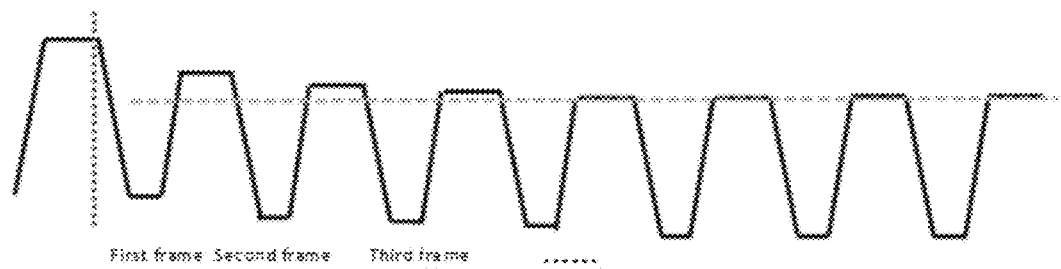
FIG. 10 is a schematic diagram illustrating that a potential at an N point changes periodically after a data signal Vdata is written into a pixel circuit in a display panel according to the embodiment of the present disclosure.

FIG. 10 is a schematic diagram illustrating that a potential at an N point changes periodically after a data signal Vdata is written into a pixel circuit in a display panel according to the embodiment of the present disclosure. Referring to FIGS. 6 and 10. FIG. 10 shows that a potential at an N point changes periodically after a data signal Vdata is written into a pixel circuit. When the picture displayed by the display panel is switched from a dark picture to a bright picture, a voltage of the data signal Vdata is reduced, but cannot reach a steady state level quickly due to residual charges in the capacitor C, so that potentials of the N points corresponding to the first frame of picture and the first several frames of pictures are higher than those in the steady state. When the driving transistor Td is a PMOS (Positive channel Metal Oxide Semiconductor, referred to as PMOS), the driving current of the light emitting device E is small, which results in low luminance of pictures corresponding to the first frame of picture and the first several frames of pictures.

And accordingly, it causes the initial frame luminance proportion to decrease when the picture displayed by the display panel is switched from a black picture to a pure color picture of a certain color.

According to the calculation formula of the capacitance: the capacitance is $C'=\varepsilon S/d=Q/U$, where e is the dielectric constant of the capacitor, S is an effective plate area of the capacitor (an area of portions of plates of the capacitor directly facing to each other), d is a distance between the plates (plate distance) of the capacitor, Q is an amount of charges on one plate of the capacitor (i.e., the amount of charges carried by the capacitor), and U is the potential difference between the two plates of the capacitor. Illustratively, $U=V_{DD}-\Phi N$ ($\Phi_N$ is a potential of the N point; $V_{DD}$ is a potential of the plate opposite to the plate to which the N point is connected). It may be deduced that, under the condition of a certain amount of charges Q, the potential of the N point may be reduced by increasing the capacitance, and further, the initial frame luminance proportion may be increased.

On this basis, the first initial frame luminance proportion, the second initial frame luminance proportion, and the third initial frame luminance proportion can be adjusted by adjusting the capacitances of the first capacitor C1, the second capacitor C2, and the third capacitor C3.

FIG. 11 is a graph showing the luminance of a first sub-pixel versus a data signal Vdata in a display panel according to the embodiment of the present disclosure; FIG. 12 is a graph showing the luminance of a second sub-pixel versus a data signal Vdata in a display panel according to the embodiment of the present disclosure. Referring to FIGS. 11 and 12, a relationship of the luminance of the first sub-pixel as the data signal Vdata and a relationship of the luminance of the second sub-pixel as the data signal Vdata is obtained according to the actually measured data of the product, so that the corresponding variation curves may be fitted (the corresponding variation curves are respectively shown in FIGS. 11 and 12). Referring to FIG. 6, when the switching transistor Ts is turned on, the potential at the N point is equal to the data signal Vdata. Therefore, the relationships of the brightness of the first sub-pixel and the second sub-pixel as the potential at the N point respectively corresponding to the data signal Vdata may be shown in FIGS. 11 and 12, respectively.

FIG. 13 shows a simulation result of the brightness of a first sub-pixel versus a data signal Vdata; FIG. 14 shows a simulation result of the luminance of a second sub-pixel versus a data signal Vdata. FIGS. 13 and 14 show simulation results of the brightness of a first sub-pixel and a second sub-pixel versus a data signal Vdata, respectively. If the Max-Min of the first initial frame luminance proportion, the second initial frame luminance proportion, and the third initial frame luminance proportion is to be controlled, and the first initial frame luminance proportion, the second initial frame luminance proportion, and the third initial frame luminance proportion are to be adjusted to levels equivalent to each other (for example, the first initial frame luminance proportion (64% as shown in FIG. 13) and the second initial frame luminance proportion (59% as shown in FIG. 13) are to be increased to the third initial frame luminance proportion (79% as shown in FIG. 13)), the corresponding potential at the N point in the first pixel circuit and the second pixel circuit are to be decreased, respectively (the corresponding potential at the N point in the first pixel circuit is adjusted from 2.94V to 2.78V as shown in FIG. 13, and the corresponding potential at the N point in the second pixel circuit is adjusted from 3.48V to 3.31V as shown in FIG. 13). This may be accomplished by adjusting the capacitance of the first capacitor C1, the capacitance of the second capacitor C2, and the capacitance of the third capacitor C3, for example, by decreasing the capacitance of the first capacitor C1 and the capacitance of the second capacitor C2, respectively.

In some embodiments, a ratio of the capacitance of the first capacitor C1 to the capacitance of the third capacitor is greater than or equal to 0.91 and less than 1; and/or a ratio of the capacitance of the second capacitor to the capacitance of the third capacitor is greater than or equal to 0.87 and less than 1. For example, the ratio of the capacitance of the first capacitor to the capacitance of the third capacitor is greater than or equal to 0.91 and less than 1; and the ratio of the capacitance of the second capacitor to the capacitance of the third capacitor is greater than 0.87 and less than 1. When the capacitance of the first capacitor, the capacitance of the second capacitor, and the capacitance of the third capacitor satisfy such the ratio, it is possible to realize that the Max-Min of the first initial frame luminance proportion, the second initial frame luminance proportion, and the third initial frame luminance proportion is less than or equal to 20%. Illustratively, the ratio of the capacitances of the first, second and third capacitors is 0.91:0.87:1.

From the capacitance $C'=\varepsilon S/d$, the capacitance of the capacitor may be adjusted by changing the dielectric constant of the capacitor, the effective plate area of the capacitor, and the distance between the plates of the capacitor. Illustratively, the dielectric constant of the capacitor is changed by changing the dielectric material between the capacitor plates, thereby adjusting the capacitance of the capacitor. For example, the dielectric material used in the capacitor may be SiNx, SiOx, or SiONx. Illustratively, the effective plate area of the capacitor and the distance between the plates of the capacitor may be changed by changing the structure of the pixel circuit, so as to adjust the capacitance of the capacitor. For example, in a manufacturing process of a display panel, the area of the upper and lower electrode plates of the capacitor directly facing to each other may be changed by changing a pattern (for example, a size of the pattern) of a conductive layer; the distance between the two plates of the capacitor may be increased by adding an insulating medium layer between the two plates; or a thickness of the insulating medium layer between the two plates of the capacitor is reduced to reduce the distance between the two plates.

In some embodiments, plate distances of the first capacitor, the second capacitor and the third capacitor are equal to each other, and dielectric constants of the first capacitor, the second capacitor and the third capacitor are equal to each other; a ratio of an effective plate area of the first capacitor to an effective plate area of the third capacitor is greater than or equal to 0.91 and less than 1; and/or a ratio of an effective plate area of the second capacitor to the effective plate area of the third capacitor is greater than or equal to 0.87 and less than 1. For example, plate distances of the first capacitor, the second capacitor and the third capacitor are the same, and dielectric constants of the first capacitor, the second capacitor and the third capacitor are the same; the ratio of the effective plate area of the first capacitor to the effective plate area of the third capacitor is greater than or equal to 0.91 and less than 1; and the ratio of the effective plate area of the second capacitor to the effective plate area of the third capacitor is greater than or equal to 0.87 and less than 1. When the effective plate area of the first capacitor, the effective plate area of the second capacitor and the effective plate area of the third capacitor satisfy such the ratio, it is possible to realize that the Max-Min of the first initial frame luminance proportion, the second initial frame luminance proportion, and the third initial frame luminance proportion is less than or equal to 20%. Illustratively, the ratio of the effective plate area of the first capacitor, the effective plate area of the second capacitor and the effective plate area of the third capacitor is 0.91:0.87:1.

In some embodiments, the effective plate areas of the first capacitor, the second capacitor and the third capacitor are equal to each other, and plate distances of the first capacitor, the second capacitor and the third capacitor are equal to each other; a ratio of the dielectric constant of the first capacitor to the dielectric constant of the third capacitor is greater than or equal to 0.91 and less than 1; and/or a ratio of the dielectric constant of the second capacitor to the dielectric constant of the third capacitor is greater than or equal to 0.87 and less than 1. For example, the effective plate areas of the first capacitor, the second capacitor and the third capacitor are equal to each other, and plate distances of the first capacitor, the second capacitor and the third capacitor are equal to each other; the ratio of the dielectric constant of the first capacitor to the dielectric constant of the third capacitor is greater than or equal to 0.91 and less than 1; and the ratio of the dielectric constant of the second capacitor to the dielectric constant of the third capacitor is greater than or equal to 0.87 and less than 1. When the dielectric constant of the first capacitor, the dielectric constant of the second capacitor and the dielectric constant of the third capacitor satisfy such the ratio, it is possible to realize that the Max-Min of the first initial frame luminance proportion, the second initial frame luminance proportion, and the third initial frame luminance proportion is less than or equal to 20%. Illustratively, the ratio of the dielectric constant of the first capacitor, the dielectric constant of the second capacitor and the dielectric constant of the third capacitor is 0.91:0.87:1.

In some embodiments, the effective plate areas of the first capacitor, the second capacitor and the third capacitor are equal to each other, and dielectric constants of the first capacitor, the second capacitor and the third capacitor are equal to each other, a ratio of a plate distance of the first capacitor to a plate distance of the third capacitor is greater than 1 and less than or equal to 1.1; and/or a ratio of a plate distance of the second capacitor to the plate distance of the third capacitor is greater than 1 and less than or equal to 1.15. For example, the effective plate areas of the first capacitor, the second capacitor and the third capacitor are equal to each other, and dielectric constants of the first capacitor, the second capacitor and the third capacitor are equal to each other; the ratio of the plate distance of the first capacitor to the plate distance of the third capacitor is greater than 1 and less than or equal to 1.1; and the ratio of the plate distance of the second capacitor to the plate distance of the third capacitor is greater than 1 and less than or equal to 1.15. When the plate distance of the first capacitor, the plate distance of the second capacitor and the plate distance of the third capacitor satisfy such the ratio, it is possible to realize that the Max-Min of the first initial frame luminance proportion, the second initial frame luminance proportion, and the third initial frame luminance proportion is less than or equal to 20%. Illustratively, the ratio of the plate distance of the first capacitor, the plate distance of the second capacitor and the plate distance of the third capacitor is 1.1:1.15:1.

Besides changing the capacitance of the capacitor of the sub-pixel, the doping proportion of the doping material of the light emitting layer in the sub-pixel may be changed, such that the first initial frame luminance proportion, the second initial frame luminance proportion and the third initial frame luminance proportion may be adjusted. The doping proportion of the doping material is a ratio of a volume of the doping material to a volume of the light emitting layer. In the manufacturing process of the light emitting layer, the main material and the doping material may be respectively injected by two nozzles to dope the main material with the doping material, thereby forming the light emitting layer. The ratio of the volume of the doping material to the volume of the whole light emitting layer is controlled by controlling a speed of the two nozzles injecting the material.

In some embodiments, the first light emitting device is an organic light emitting device capable of emitting red light and includes a first light emitting layer; the second light emitting device is an organic light emitting device capable of emitting green light and includes a second light emitting layer; the third light emitting device is an organic light emitting device capable of emitting blue light, and includes a third light emitting layer. A ratio of a volume of the doping material to a volume of the second light emitting layer in the second light emitting layer (i.e. the doping proportion of the doping material in the second light emitting layer) is 1% to 4%. Illustratively, the ratio of the volume of the doping material to the volume of the second light emitting layer in the second light emitting layer is 2%, 3%, or 4%.

In some embodiments, a ratio of a volume of the doping material to a volume of the first light emitting layer in the first light emitting layer (i.e. the doping proportion of the doping material in the first light emitting layer) is 1% to 4%, and/or a ratio of a volume of the doping material to a volume of the third light emitting layer in the third light emitting layer (i.e. the doping proportion of the doping material in the third light emitting layer) is 1% to 4%. For example, the ratio of the volume of the doping material to the volume of the first light emitting layer in the first light emitting layer is 1% to 4%, and the ratio of the volume of the doping material to the volume of the third light emitting layer in the third light emitting layer is 1% to 4%. On this basis, the ratio of the volume of the doping material to the volume of the second light emitting layer in the second light emitting layer may be 2% to 4%. For example, the ratio of the volume of the doping material to the volume of the first light emitting layer in the first light emitting layer is 1% to 4%, and the ratio of the volume of the doping material to the volume of the third light emitting layer in the third light emitting layer is 1% to 4% and the ratio of the volume of the doping material to the volume of the second light emitting layer in the second light emitting layer may be 1% to 4%.

Specifically, as shown in FIG. 15, FIG. 15 is a data diagram of a fourth initial frame luminance proportion, a first initial frame luminance proportion, a second initial frame luminance proportion, and a third initial frame luminance proportion when a doping proportion of a doping material in a second light emitting layer is 4% or 2%. The fourth initial frame brightness proportion is a ratio of the brightness of the first frame of picture to the maximum brightness of the stabilized multiple frames of pictures from the time when the picture displayed by the display panel is switched from a black picture to a white picture. It may be seen that by reducing the doping proportion of the doping material in the second light emitting layer, the second initial frame brightness proportion is increased from 59% to 67%, so that the Max-Min of the first initial frame brightness proportion, the second initial frame brightness proportion, and the third initial frame brightness proportion decreases from 20% to 11%.

In the display panel provided by the embodiment of the present disclosure, the Max-Min of the first initial frame brightness proportion, the second initial frame brightness proportion, and the third initial frame brightness proportion is less than or equal to a threshold (e.g., 20%). When the display panel is configured to display in the dark background mode and the position of the light-colored display content in the display screen changes, some pixels in the display panel may switch from a state with a smaller brightness to a state with a larger brightness, and the first sub-pixel, the second sub-pixel and the third sub-pixel corresponding to the pixels may also switch from the state with the smaller brightness to the state with the larger brightness, and the brightness of each of the first sub-pixel, the second sub-pixel and the third sub-pixel gradually increases until a stable display state is reached. When the first initial frame brightness proportion, the second initial frame brightness proportion, and the third initial frame brightness proportion have the Max-Min of less than or equal to a threshold (for example, 20%), in the above process, a ratio of the brightness of light of the first color emitted by the first sub-pixel, the brightness of light of the second color emitted by the second sub-pixel, and the brightness of light of the third color emitted by the third sub-pixel in several frames of pictures before reaching the stable display state deviates from, a ratio of the brightness of light of the first color emitted by the first sub-pixel, the brightness of light of the second color emitted by the second sub-pixel and the brightness of light of the third color emitted by the third sub-pixel in the stable display state, to a smaller degree, so that a difference between the color of the light-colored display content in the first several frames of pictures and the color of the light-colored display content in the stable display state is smaller, and thus, is difficult to be perceived by human eyes. Therefore, the problem, in which the color cast occurs due to the changing position of the light-colored display content in the pictures displayed by the display panel in the dark background mode, may be solved.

It may be understood that the display device provided by the embodiment of the present disclosure includes the display panel described above. Therefore, in the display device provided in the embodiment of the present disclosure, the Max-Min of the first initial frame brightness proportion, the second initial frame brightness proportion, and the third initial frame brightness proportion is less than or equal to a threshold (e.g., 20%). When the display panel is configured to display in the dark background mode and the position of the light-colored display content in the display screen changes, some pixels in the display panel may switch from a state with a smaller brightness to a state with a larger brightness, and the first sub-pixel, the second sub-pixel and the third sub-pixel corresponding to the pixels may also switch from the state with the smaller brightness to the state with the larger brightness, and the brightness of each of the first sub-pixel, the second sub-pixel and the third sub-pixel gradually increases until a stable display state is reached. When the first initial frame brightness proportion, the second initial frame brightness proportion, and the third initial frame brightness proportion have the Max-Min of less than or equal to a threshold (for example, 20%), in the above process, a ratio of the brightness of light of the first color emitted by the first sub-pixel, the brightness of light of the second color emitted by the second sub-pixel, and the brightness of light of the third color emitted by the third sub-pixel in several frames of pictures before reaching the stable display state deviates from, a ratio of the brightness of light of the first color emitted by the first sub-pixel, the brightness of light of the second color emitted by the second sub-pixel and the brightness of light of the third color emitted by the third sub-pixel in the stable display state, to a smaller degree, so that a difference between the color of the light-colored display content in the first several frames of pictures and the color of the light-colored display content in the stable display state is smaller, and thus, is difficult to be perceived by human eyes. Therefore, the problem, in which the color cast occurs due to the changing position of the light-colored display content in the pictures displayed by the display panel in the dark background mode, may be solved.

Finally, it should be noted that: the above embodiments are only intended to illustrate and not to limit the technical solution of the present disclosure; although the present disclosure has been described in detail with reference to the foregoing embodiments, it should be understood by one of ordinary skill in the art that: the technical solutions described in the foregoing embodiments may still be modified, or some technical features in the foregoing embodiments may be equivalently replaced; such modifications and substitutions do not cause the essence of respective technical solutions to depart from the spirit and scope of the technical solutions of the embodiments of the present disclosure.

What is claimed is:

1. A display panel, comprising:
a first sub-pixel, a second sub-pixel, and a third sub-pixel, wherein the first sub-pixel is configured to display a first color, the second sub-pixel is configured to display a second color, and the third sub-pixel is configured to display a third color;
when a picture displayed by the display panel is switched from a black picture to a picture having a maximum gray scale of the first color, a ratio of a brightness of a first frame of picture to a maximum value among brightness of stabilized several frames of pictures is a first initial frame brightness proportion;
when a picture displayed by the display panel is switched from a black picture to a picture having a maximum gray scale of the second color, a ratio of a brightness of a first frame of picture to a maximum value among brightness of stabilized several frames of pictures is a second initial frame brightness proportion;
when a picture displayed by the display panel is switched from a black picture to a picture having a maximum gray scale of the third color, a ratio of a brightness of a first frame of picture to a maximum value among brightness of stabilized several frames of pictures is a third initial frame brightness proportion; and
the first initial frame brightness proportion, the second initial frame brightness proportion and the third initial frame brightness proportion have a Max-Min less than or equal to a threshold.

2. A display device comprising the display panel of claim 1.

3. The display device of claim 2, wherein
the first sub-pixel comprises a first light emitting device and a first pixel circuit configured to drive the first light emitting device to emit light, the first pixel circuit comprising a first driving transistor and a first capacitor coupled to a gate of the first driving transistor;
the second sub-pixel comprises a second light emitting device and a second pixel circuit configured to drive the second light emitting device to emit light, the second pixel circuit comprising a second driving transistor and a second capacitor coupled to a gate of the second driving transistor; and
the third sub-pixel comprises a third light emitting device and a third pixel circuit configured to drive the third light emitting device to emit light, the third pixel circuit comprising a third driving transistor and a third capacitor coupled to a gate of the third driving transistor.

4. The display device of claim 3, wherein
a ratio of a capacitance of the first capacitor to a capacitance of the third capacitor is greater than or equal to 0.91 and less than 1; and/or
a ratio of a capacitance of the second capacitor to the capacitance of the third capacitor is greater than or equal to 0.87 and less than 1.

5. The display device of claim 4, wherein
plate distances of the first capacitor, the second capacitor and the third capacitor are equal to each other, and dielectric constants of the first capacitor, the second capacitor and the third capacitor are equal to each other; and
a ratio of an effective plate area of the first capacitor to an effective plate area of the third capacitor is greater than or equal to 0.91 and less than 1; and/or a ratio of an effective plate area of the second capacitor to the effective plate area of plates of the third capacitor is greater than or equal to 0.87 and less than 1.

6. The display device of claim 4, wherein
effective plate areas of the first capacitor, the second capacitor and the third capacitor are equal to each other, and dielectric constants of the first capacitor, the second capacitor and the third capacitor are equal to each other;
a ratio of a plate distance of the first capacitor to a plate distance of the third capacitor is greater than 1 and less than or equal to 1.1; and/or a ratio of a plate distance of the second capacitor to the plate distance of the third capacitor is greater than 1 and less than or equal to 1.15.

7. The display device of claim 3, wherein
the first light emitting device is an organic light emitting device for emitting red light and comprises a first light emitting layer, the second light emitting device is an organic light emitting device for emitting green light and comprises a second light emitting layer; the third light emitting device is an organic light emitting device for emitting blue light and comprises a third light emitting layer; and
a ratio of a volume of a doping material in the second light emitting layer to a volume of the second light emitting layer is 1% to 4%.

8. The display panel of claim 1, wherein
the first sub-pixel comprises a first light emitting device and a first pixel circuit configured to drive the first light emitting device to emit light, the first pixel circuit comprising a first driving transistor and a first capacitor coupled to a gate of the first driving transistor;
the second sub-pixel comprises a second light emitting device and a second pixel circuit configured to drive the second light emitting device to emit light, the second pixel circuit comprising a second driving transistor and a second capacitor coupled to a gate of the second driving transistor; and
the third sub-pixel comprises a third light emitting device and a third pixel circuit configured to drive the third light emitting device to emit light, the third pixel circuit comprising a third driving transistor and a third capacitor coupled to a gate of the third driving transistor.

9. The display panel of claim 8, wherein
a ratio of a capacitance of the first capacitor to a capacitance of the third capacitor is greater than or equal to 0.91 and less than 1; and/or
a ratio of a capacitance of the second capacitor to the capacitance of the third capacitor is greater than or equal to 0.87 and less than 1.

10. The display panel of claim 9, wherein
plate distances of the first capacitor, the second capacitor and the third capacitor are equal to each other, and dielectric constants of the first capacitor, the second capacitor and the third capacitor are equal to each other; and
a ratio of an effective plate area of the first capacitor to an effective plate area of the third capacitor is greater than or equal to 0.91 and less than 1; and/or a ratio of an effective plate area of the second capacitor to the effective plate area of the third capacitor is greater than or equal to 0.87 and less than 1.

11. The display panel of claim 9, wherein
effective plate areas of the first capacitor, the second capacitor and the third capacitor are equal to each other, and plate distances of the first capacitor, the second capacitor and the third capacitor are equal to each other;
a ratio of a dielectric constant of the first capacitor to a dielectric constant of the third capacitor is greater than or equal to 0.91 and less than 1; and/or a ratio of a dielectric constant of the second capacitor to the dielectric constant of the third capacitor is greater than or equal to 0.87 and less than 1.

12. The display panel of claim 9, wherein
effective plate areas of the first capacitor, the second capacitor and the third capacitor are equal to each other, and dielectric constants of the first capacitor, the second capacitor and the third capacitor are equal to each other;
a ratio of a plate distance of the first capacitor to a plate distance of the third capacitor is greater than 1 and less than or equal to 1.1; and/or a ratio of a plate distance of the second capacitor to the plate distance of the third capacitor is greater than 1 and less than or equal to 1.15.

13. The display panel of claim 9, wherein
the first light emitting device is an organic light emitting device for emitting red light and comprises a first light emitting layer; the second light emitting device is an organic light emitting device for emitting green light and comprises a second light emitting layer; the third light emitting device is an organic light emitting device for emitting blue light and comprises a third light emitting layer; and
a ratio of a volume of a doping material in the second light emitting layer to a volume of the second light emitting layer is 1% to 4%.

14. The display panel of claim 8, wherein
the first light emitting device is an organic light emitting device for emitting red light and comprises a first light emitting layer; the second light emitting device is an organic light emitting device for emitting green light and comprises a second light emitting layer; the third light emitting device is an organic light emitting device for emitting blue light and comprises a third light emitting layer; and
a ratio of a volume of a doping material in the second light emitting layer to a volume of the second light emitting layer is 1% to 4%.

15. The display panel of claim 14, wherein
the doping material in the second light emitting layer is coumarin and a derivative thereof and iridium complex.

16. The display panel of claim 14, wherein
the ratio of the volume of the doping material in the second light emitting layer to the volume of the second light emitting layer is 2% to 4%.

17. The display panel of claim 14, wherein
a ratio of a volume of a doping material in the first light emitting layer to a volume of the first light emitting layer is 1% to 4%; and/or
a ratio of a volume of a doping material in the third light emitting layer to a volume of the third light emitting layer is 1% to 4%.

18. The display panel of claim 1, wherein
the threshold is in a range of 0 to 20%.

19. The display panel of claim 18, wherein
the threshold is 11%.

20. The display panel of claim 1, wherein the first color is red, the second color is green, and the third color is blue.

* * * * *